(12) United States Patent
Takeishi

(10) Patent No.: US 6,411,365 B1
(45) Date of Patent: *Jun. 25, 2002

(54) EXPOSURE METHOD AND EXPOSURE APPARATUS

(75) Inventor: Hiroaki Takeishi, Utsunomiya (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/444,516

(22) Filed: Nov. 22, 1999

(30) Foreign Application Priority Data

Nov. 27, 1998 (JP) ............................................. 10-352166

(51) Int. Cl.⁷ .......................... G03B 27/42; G03B 27/32
(52) U.S. Cl. ........................................ 355/53; 355/77
(58) Field of Search ............................. 355/53, 55, 67, 355/77; 356/399–401; 250/548

(56) References Cited

U.S. PATENT DOCUMENTS

| | | | | |
|---|---|---|---|---|
| 5,699,145 A | * | 12/1997 | Makinouchi et al. | 355/53 |
| 5,699,146 A | * | 12/1997 | Kaminaga | 355/53 |
| 5,907,392 A | * | 5/1999 | Makinouchi | 355/53 |
| 5,936,710 A | * | 8/1999 | Itoh et al. | 355/53 |
| 6,195,155 B1 | * | 2/2001 | Kawai | 355/53 |
| 6,277,533 B1 | * | 8/2001 | Wakamoto et al. | 430/30 |

FOREIGN PATENT DOCUMENTS

JP          9-106939          4/1997

* cited by examiner

*Primary Examiner*—Russell Adams
*Assistant Examiner*—Hung Henry Nguyen
(74) *Attorney, Agent, or Firm*—Fitzpatrick, Cella, Harper & Scinto

(57) ABSTRACT

An exposure apparatus for scanning a reticle and a wafer in synchronism to optically transfer a pattern drawn on the reticle onto the wafer, thereby forming a device. The apparatus includes a first driver for holding and scanning the reticle, a second driver for holding and scanning the wafer, a determining device and a controller. The determining device determines a scanning distance of the first driver and the second driver by a sum of a first distance through which the first driver and the second driver travel until reaching a scanning speed, a second distance through which the first driver and the second driver travel during exposure and a third distance through which the first driver and the second driver travel during a settling time from a time when the first driver and the second driver reach the scanning speed to a time when exposure is enabled. The controller controls the first driver and the second driver by exposure parameters, the settling time being variably set in accordance with the exposure parameters.

16 Claims, 8 Drawing Sheets

EXPOSURE METHOD AND EXPOSURE APPARATUS

BACKGROUND OF THE INVENTION

The present invention relates to an exposure method for transferring a pattern image on a mask substrate onto a target exposure substrate by scanning the mask substrate and the target exposure substrate in synchronism, and a scanning exposure apparatus employing this method. Such an exposure apparatus is used in the manufacture of devices, e.g., a semiconductor chip such as an IC or LSI, a liquid crystal panel, a CCD, a thin-film magnetic head, a micromachine, or the like.

Among semiconductor exposure apparatuses, a step-by-step movable exposure apparatus (a so-called stepper), in which a stage mounted with a wafer is positioned within a plane and exposure is repeated, has been mainstream. In recent years, an increase in micropatterning degree of semiconductor circuits allows the advent of a so-called scanning exposure apparatus in which a mask substrate (reticle), where a circuit pattern is drawn, and a target exposure substrate (wafer) are mounted on stages, respectively, and are exposed while being scanned in synchronism. An expectation for this scanning exposure apparatus has been increasing. This is partly because a larger exposure field can be obtained than in a stepper so that the contrast can be set uniform easily, which is a feature unique to scanning exposure.

Although the scanning exposure apparatus has the advantage as described above, it has a disadvantage in that, when compared to the stepper, the time required for exposing one wafer entirely is difficult to shorten, i.e., the throughput of the apparatus is difficult to increase.

In particular, this phenomenon becomes conspicuous when performing scanning exposure at a low speed. In an actual process, since limitations are imposed by the resist sensitivity and the exposure image quality is of a primary importance, scanning exposure at a low speed is unavoidable. An exposure apparatus in which the scanning speed is variable to control the exposure amount is proposed in, e.g., Japanese Patent Laid-Open No. 9-106939. In this case as well, scanning exposure at a low speed may be performed.

When performing scanning exposure, respective stages in a conventional scanning exposure apparatus operate in the following manner.

①  The stages are accelerated up to a scanning speed determined by the process conditions.

②  The reticle stage and the wafer stage are synchronized, and transient response is controlled until the error (synchronization error) between them becomes a predetermined value or less. During this control operation, the stages idle. The period from when the stages reach a predetermined speed to the point, in time, when the synchronization error is equal to or less than a predetermined value and the exposure apparatus starts exposure, is called the settling time.

③  Light emitted by the light source is projected onto the wafer for an exposure field.

④  The stages are positioned in the same manner as in the control operation of the transient response performed in item ②. More specifically, the stages idle in the same manner as in item ② by a distance corresponding to the idling distance in item ②. Note that light projected onto the wafer in the next exposure field is scanned in a direction opposite to that for the immediately preceding exposure field. This is because to eliminate overlapping stage movement is advantageous in terms of throughput.

⑤  The stages are decelerated for the next shot until the speed becomes zero.

Items ①, ③, and ⑤ are indispensable to satisfy the maximum acceleration limit for the stages and to assure the exposure field length. Regarding items ② and ④, they are usually determined by the maximum scanning speed possible for the apparatus, which is the strictest condition for the apparatus. Generally, the larger the scanning speed and the stage acceleration, the longer the settling time must be. FIG. 4 shows a stage deviation (synchronization error) waveform obtained by changing the scanning speed. When the scanning speed increases, the overshoot amount of the synchronization error increases, and the settling time is prolonged.

In the scanning exposure apparatus, the stroke amount of scanning of each stage must be determined by considering these conditions. In order to realize this, conventionally, the stroke amount was obtained by a process shown in the block diagram of FIG. 5. This determination process will be described.

A scanning speed setting unit 1 sets a scanning speed V under various conditions of the device manufacturing process. A stage acceleration/deceleration parameter setting unit 2 determines stage acceleration/deceleration parameters depending on factors such as the maximum acceleration possible for the stage. For example, when a stage acceleration/deceleration target position is to be generated in accordance with an S-shaped speed pattern, a maximum acceleration A and a time Tj required until reaching the maximum acceleration A are generated as the parameters. A settling time determination unit 22 sets a minimum value Ts allowed with the maximum scanning speed, as described above. An exposure field length (Xe) setting unit 4 is also provided.

Under these conditions, a stroke amount determination unit 5' obtains a scanning speed reach stroke and a stroke necessary for deceleration from the scanning speed (corresponding to ① described above), a distance through which the stage travels within the settling time (corresponding to ② and ④ described above), and an exposure field length (corresponding to ③ described above), and calculates a stage stroke amount X as the sum.

As described above, in the prior art, the various types of parameters required when determining the stroke amount are processed as independent parameters. As described above, as the settling time, a value that satisfies both the maximum scanning speed and the maximum acceleration is used. Accordingly, the lower the scanning speed, the longer the settling time, which is a paradox. As a result, the throughput is sacrificed in this case.

The settling time is also influenced by the jerk time, the shot position, the scanning direction, and the like. In the prior art, the settling time is determined for the maximum scanning speed and the maximum acceleration that can be satisfied even under conditions or in occasions where the jerk time, the shot position, the scanning direction, and the like are the worst.

SUMMARY OF THE INVENTION

The present invention has been made in consideration of the problems of the prior art described above, and has as its object to provide an exposure method and exposure apparatus for increasing the throughput of scanning exposure. It is another object of the present invention to provide a method of manufacturing a semiconductor device by using such exposure method and exposure apparatus. The exposure method and exposure apparatus according to the present invention that achieve these objects have the following steps and arrangement, respectively.

That is, there is provided an exposure method of scanning and exposing a substrate at a constant speed, comprising variably setting, in accordance with a predetermined condition, a settling time which lapses from a time when a substrate reaches a constant scanning speed by acceleration to a start of exposure.

There is also provided an exposure method of scanning and exposing a substrate at a constant speed, comprising the steps of setting the constant scanning speed, and setting a settling time, which lapses from a time when a substrate reaches a scanning speed by acceleration to a start of exposure, variably in accordance with at least one of the scanning speed, an acceleration, a jerk time, and a shot position.

There is also provided an exposure apparatus for scanning a reticle and a wafer in synchronism to optically transfer a pattern drawn on the reticle onto the wafer, thereby forming a device, comprising first and second drive means for holding and scanning the reticle and the wafer, wherein the first and second drive means have a scanning distance which is determined by a sum of a first distance through which the drive means travel until reaching a scanning speed, a second distance through which the drive means travel during exposure, and a third distance through which the drive means travel during a settling time from a time when the drive means reach the scanning speed to a time when exposure is enabled, and the settling time is variably set in accordance with an exposure parameter.

There is also provided a device manufacturing method comprising the steps of setting a settling time, after which exposure can be started, under a predetermined condition by applying the exposure method described above, and exposing a wafer on the basis of the preset settling time to manufacture a device, wherein the settling time allows manufacturing the device with a maximum throughput.

There is also provided a device manufacturing method comprising the steps of preparing the exposure apparatus described above, and manufacturing a device with the prepared exposure apparatus.

According to a preferable aspect of the present invention, in the exposure method described above, the predetermined condition includes at least one of a scanning speed, an acceleration, a jerk time, a shot position, and a scanning direction of the substrate.

According to another preferable aspect of the present invention, in the exposure method described above, a sum of a distance required for acceleration, a distance required for settling, and a distance through which the substrate moves during exposure changes in accordance with the scanning speed.

According to still another preferable aspect of the present invention, in the exposure method described above, the settling time is set by using a function or look-up table in which a relationship between the settling time and the scanning speed tends to increase substantially monotonically.

According to still another preferable aspect of the present invention, in the exposure method described above, the function or look-up table is updated when necessary by using a result obtained by driving the substrate.

According to still another preferable aspect of the present invention, in the exposure method described above, the substrate is a reticle and/or a wafer employed when scanning a reticle stage and a wafer stage in synchronism to transfer a pattern drawn on a reticle onto a wafer by exposure.

According to still another preferable aspect of the present invention, in the exposure method described above, the settling time is set for only one of a reticle stage and a wafer stage which has a longer settling time.

According to still another preferable aspect of the present invention, in the exposure method described above, the settling time is set for only a wafer stage.

According to still another preferable aspect of the present invention, in the exposure apparatus described above, the exposure parameter is at least one of a traveling speed, an acceleration, a jerk time, a shot position, and a traveling direction of the substrate.

According to still another preferable aspect of the present invention, in the exposure apparatus described above, the settling time is determined by using a function or look-up table in which a relationship between the settling time and the scanning speed tends to increase substantially monotonically.

According to still another preferable aspect of the present invention, in the exposure apparatus described above, the function or look-up table is updated when necessary by using a result obtained by driving the drive means.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention, and together with the description, serve to explain the principles of the invention.

DETAILED DESCRIPTION OF THE PREFERRED EMBODIMENTS

Preferred embodiments of the present invention will be described in detail in accordance with the accompanying drawings.

Figure 3:
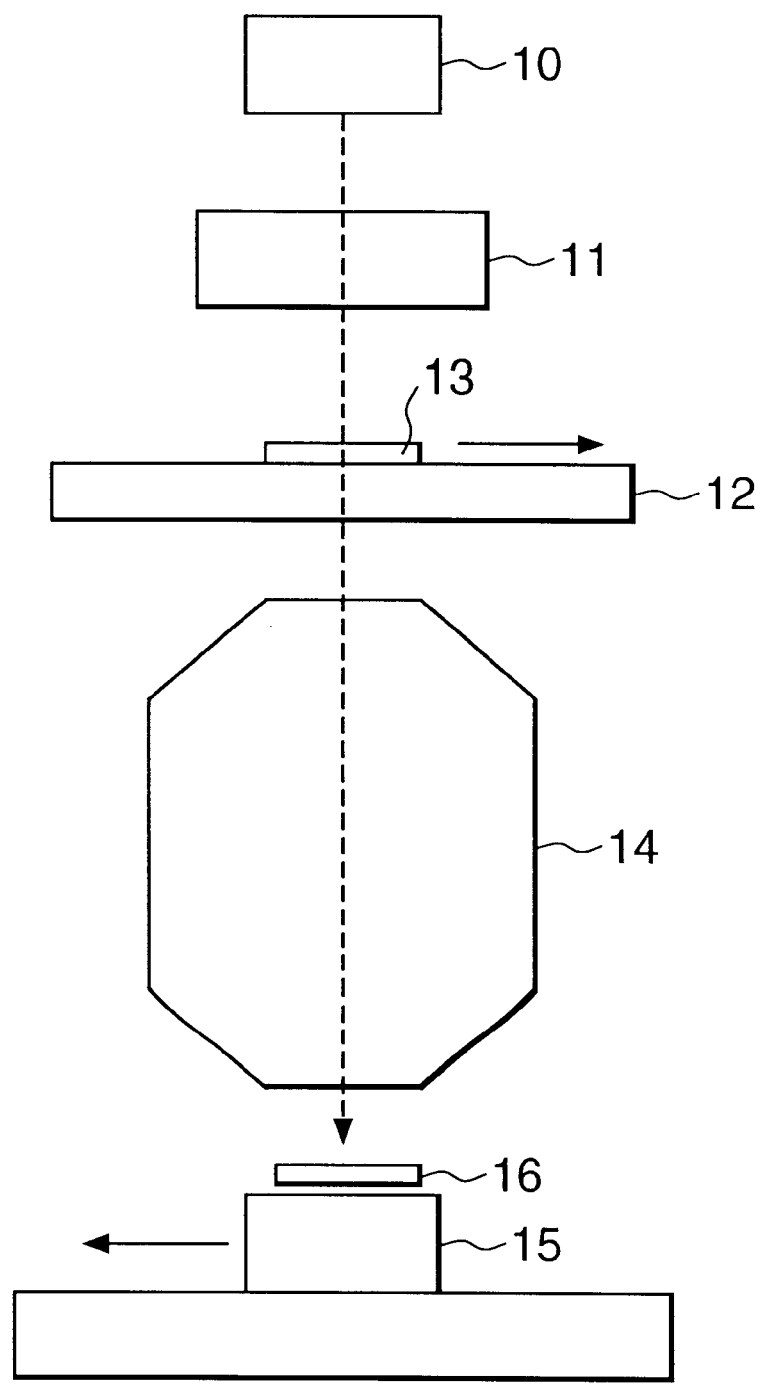
FIG. 3 is a view showing the schematic arrangement of a scanning exposure apparatus to which the present invention is applied.
Figure 4:
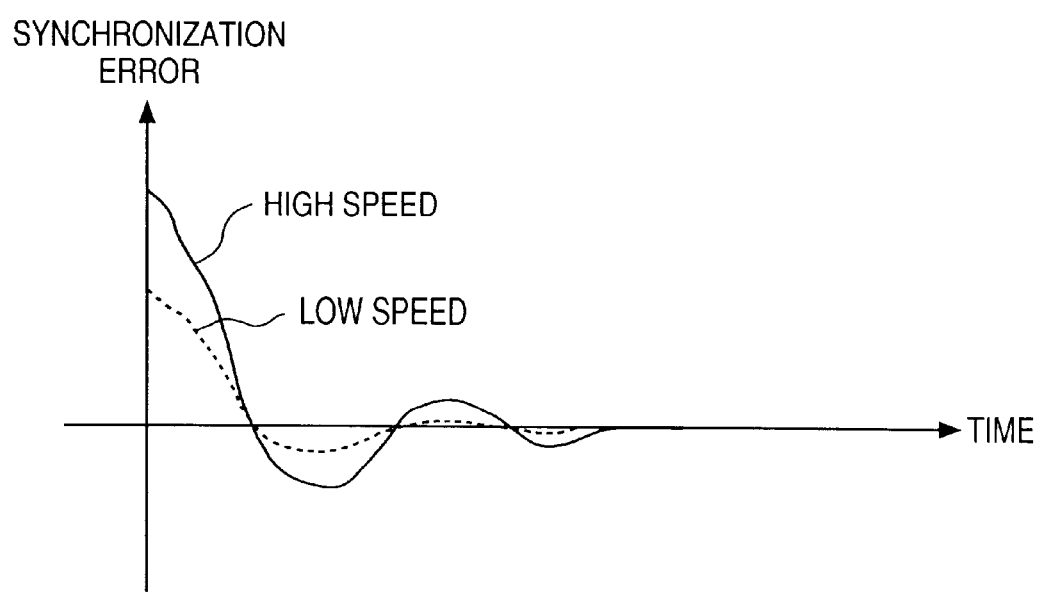
FIG. 4 is a graph showing the relationship between the scanning speed and synchronization error (settling time)
Figure 5:
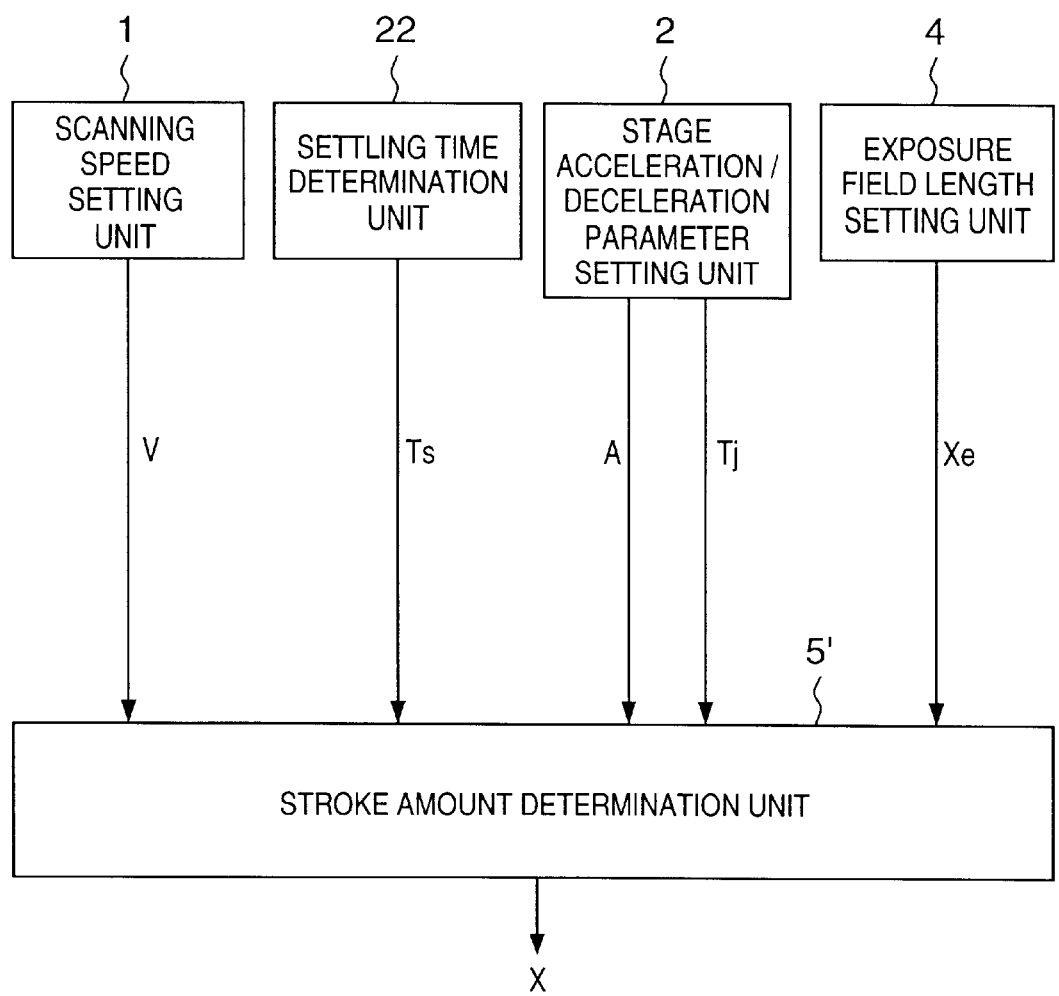
FIG. 5 is a view for explaining a conventional stroke amount determination process.

FIG. 3 is an illustration of a scanning exposure apparatus. As a light source 10, a KrF excimer laser is generally used. Light emitted by the light source 10 is shaped by an illumination optical unit 11 and is transmitted through a slit of about several mm to irradiate a reticle 13 held on a reticle stage 12. The light is then transmitted through a projection optical unit 14 to reach a wafer 16 held on a wafer stage 15. At this time, the wafer stage 15 and reticle stage 12 are moved at a constant speed in opposite directions to obtain an exposure field larger than the slit width. The wafer stage 15 and reticle stage 12 are moved in the opposite directions because the projection optical unit 14 inverts the image.

With the exposure method and exposure apparatus according to the present invention, conditions and occasions such as the scanning speed, the acceleration, the jerk time, the shot position, and the scanning direction, and corresponding settling times are related to each other. When a stroke amount is to be determined in accordance with a scanning speed given from the process conditions, the throughput can be maximized by using the settling time related to the scanning speed.

(First Embodiment)

Figure 1:
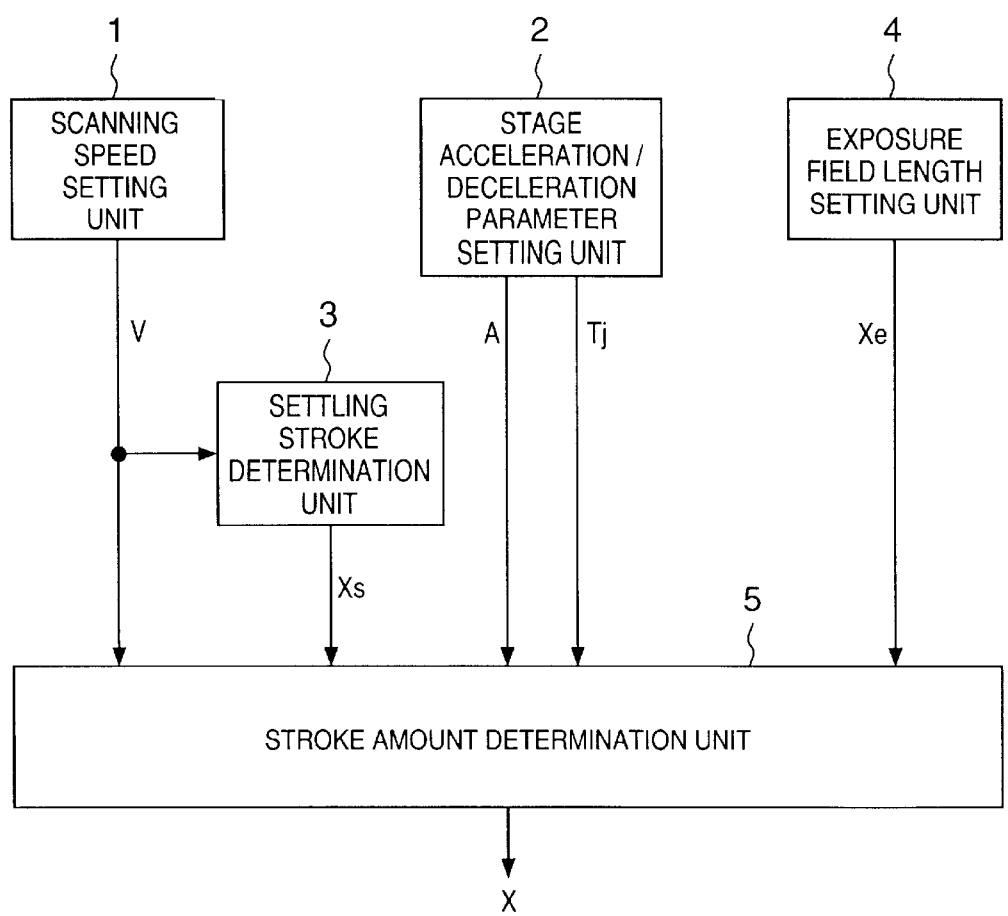
FIG. 1 is a view for explaining a stroke amount determination unit according to an embodiment of the present invention.

FIG. 1 shows a stage stroke amount determination unit according to the first embodiment of the present invention.

Referring to FIG. 1, a scanning speed setting unit 1 sets a scanning speed V under various conditions of the semiconductor manufacturing process. A stage acceleration/deceleration parameter setting unit 2 determines stage acceleration/deceleration parameters depending on factors such as the maximum acceleration allowed for the stage. In this case, assume that a stage acceleration/deceleration target position is generated in accordance with an S-shaped speed pattern, and two parameters, i.e., a maximum acceleration A and a time Tj required until reaching the maximum acceleration A, are set. A settling stroke determination unit 3 determines a settling time Ts and a stroke Xs through which the stage travels within the settling time. An exposure field length (Xe) setting unit 4 and a stroke amount determination unit 5 are also provided.

In FIG. 1, the settling stroke determination unit 3 is provided to refer to the scanning speed V set by the scanning speed setting unit 1. This is the characteristic feature of this embodiment.

Figure 2:
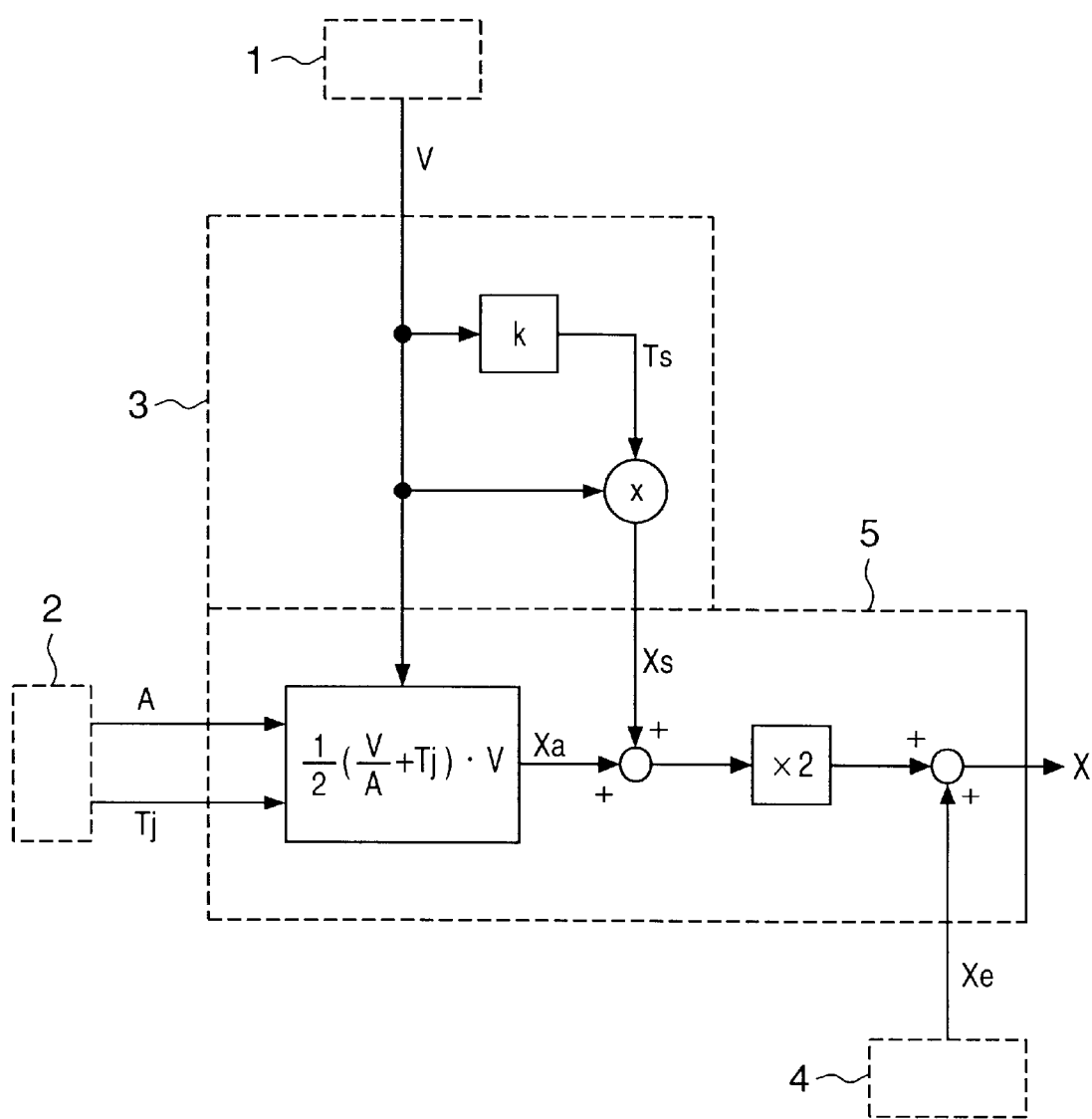
FIG. 2 is a block diagram for explaining the process of the stroke amount determination unit of FIG. 1.

FIG. 2 shows the process of the stroke amount determination unit 5 according to this embodiment by means of a block diagram. This process will be described in detail.

As the input parameters, the scanning speed V, and the stage maximum acceleration A and the maximum acceleration reach time Tj are supplied from the scanning speed setting unit 1 and the parameter setting unit 2, respectively, to the stroke amount determination unit 5.

The stroke amount determination unit 5 calculates a distance Xa, through which the stage travels until reaching the scanning speed V, by using equation (1):

$$Xa = \frac{1}{2}\{(V/A) + Tj\} \times V \tag{1}$$

The settling stroke determination unit 3 determines the settling stroke Xs. The higher the scanning speed, the longer the settling time. The setting time Ts is determined by using this tendency in accordance with a monotonically increasing linear function as shown in equation (2):

$$Ts = k \times V, \; k > 0 \tag{2}$$

In equation (2), a coefficient k of proportion may be approximated from a converging waveform obtained when moving the stages at a predetermined scanning speed. Although approximation is performed with a linear function, a function that complements the actually obtained value may be obtained and used in place of equation (2).

From this result, the distance Xs through which the stage travels during the settling time is obtained by using equation (3):

$$Xs = V \times Ts \tag{3}$$

The output Xs from the settling stroke determination unit 3 is input to the stroke amount determination unit 5. As a result, the stroke amount determination unit 5 can obtain the total stroke amount X for scanning exposure on the basis of equation (4):

$$X = 2 \times (Xa + Xs) + Xe \tag{4}$$

where Xe is an output from the exposure field length setting unit 4.

As is characteristically seen in equation (2), according to this embodiment, when determining the settling time, the scanning speed is referred to, and the settling time is obtained as a function of the scanning speed V. The lower the scanning speed, the shorter the settling time can be. Therefore, when the scanning speed is low, the travel distance may be decreased in accordance with the short settling time, so that the total stroke amount can be decreased. Accordingly, variations in throughput of the apparatus depending on the process conditions can be suppressed. A semiconductor exposure apparatus having a high throughput even during low-speed scanning exposure can be provided.

As described above, according to the exposure method of this embodiment, an optimal settling time can always be determined, and the stroke amount of the stages can be minimized. Accordingly, an exposure apparatus which achieves the maximum throughput under various process conditions can be provided.

(Second Embodiment)

In the first embodiment, the settling time is approximated by a linear function. Alternatively, a settling time which asymptotically converges to an optimal value can be determined from various kinds of information obtained when driving the stages. A method according to the second embodiment of the present invention will be described.

Figure 8:
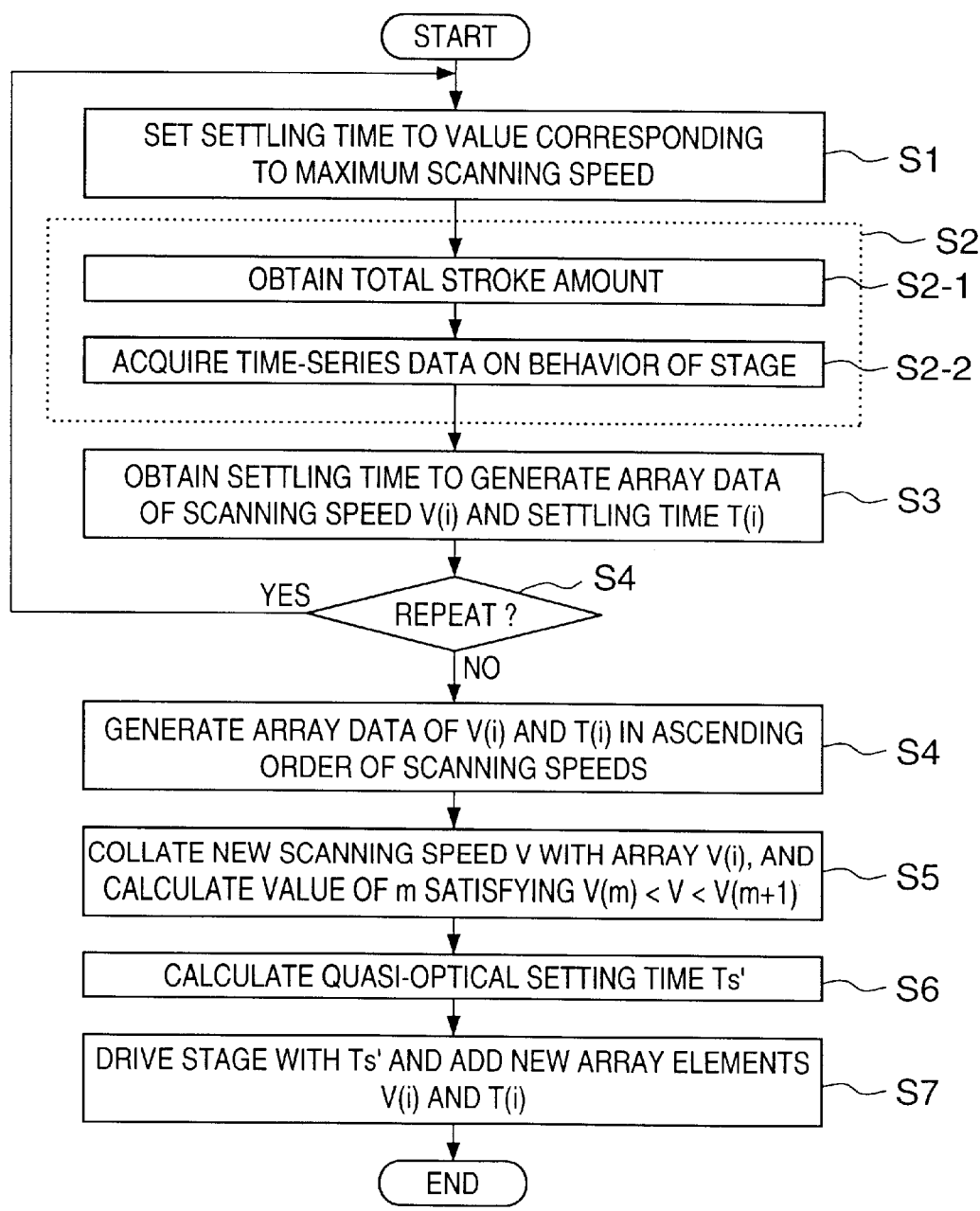
FIG. 8 is a flow chart for explaining a process for determining an asymptotically optimal settling time.

According to this embodiment, the settling time is determined in accordance with the following steps of the flow chart shown in FIG. 8.

(Step S1) The settling time Ts is set to the value corresponding to the maximum scanning speed, i.e., the maximum value Tmax.

(Step S2) In this state, the total stroke amount X is obtained. The stage is actually operated and its behavior is received as time series data. At this time, exposure may be actually performed.

(Step S3) The settling time is measured from the received data, and combined with the scanning speed at that time to generate array data. The array data may be stored in a storage medium such as a memory.

(Step S4) Steps S1 to S3 are repeated. When generating a table, data are arranged in ascending order of scanning speeds. As a result, array data (V(i), Ts(i)) in which the scanning speed and the corresponding settling time are paired is generated.

(Step S5) When a new scanning speed V is supplied, the array data is referred to to obtain an integer m satisfying inequality (5):

$$V(m) < V < V(m+1) \tag{5}$$

(Step S6) By using the integer m obtained by inequality (5), a quasi-optimal settling time Ts' for the newly supplied scanning speed V is obtained with equation (6):

$$Ts' = Ts(m) + \frac{Ts(m+1) - Ts(m)}{V(m+1) - V(m)} \times (V - V(m)) \quad (6)$$

(Step S7) The stages are driven by using the obtained Ts', and in accordance with the result of this driving operation, a new array element is added (identical to steps S1 to S4).

When the above steps are repeated, the exposure apparatus can learn the optimal settling time for each scanning speed. The settling time can be obtained stably for not only different process conditions but also different apparatuses. As a result, the settling time for each scanning speed can be determined to be the shortest, and the throughput can be maximized for each scanning speed.

In the above embodiment, the settling time depends on only the scanning speed V. However, other conditions and occasions, for example, elements such as the acceleration, the jerk time, the shot position, and the scanning direction may be employed as parameters, together with or in place of the scanning speed V, for determining the settling time.

The present invention is preferably applied to both the reticle stage 12 and wafer stage 15 of FIG. 3. Alternatively, the present invention can be applied to only a stage having a longer settling time, or only the wafer stage 15 that requires higher-degree settling.

As has been described above, according to the exposure method and the exposure apparatus of the present invention, the optimal settling time for each scanning time can be obtained by learning, and the settling time can be obtained stably for not only different process conditions but also different apparatuses. As a result, the settling time for each scanning speed can be determined to be the shortest, and the throughput can be maximized for each scanning speed.

(Embodiment of Device Manufacturing Method)

An embodiment of a semiconductor device manufacturing method utilizing the exposure method described above will be described.

Figure 6:
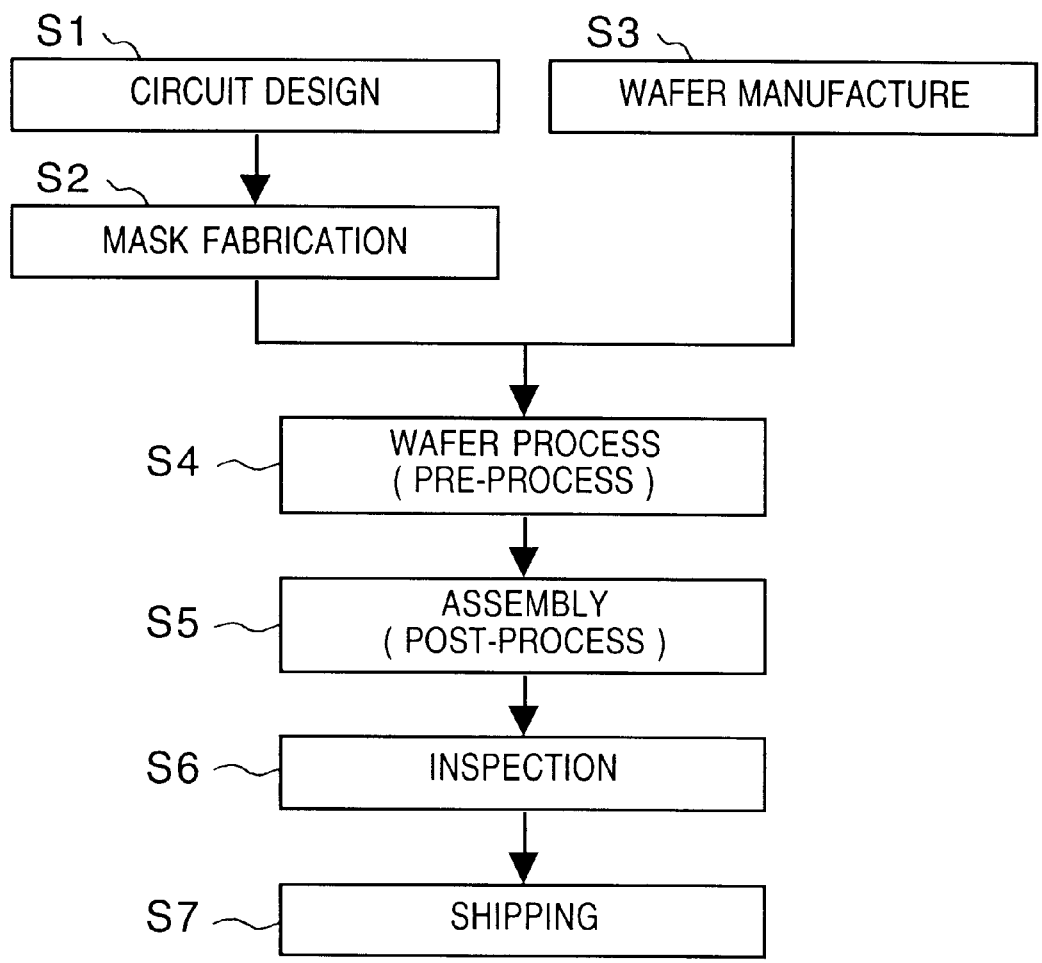
FIG. 6 is a flow chart showing the flow of the manufacture of a microdevice.

FIG. 6 shows the flow of the manufacture of a microdevice (a semiconductor chip such as an IC or LSI, a liquid crystal panel, a CCD, a thin-film magnetic head, a micromachine, or the like). In step 1 (circuit design), pattern design of the device is performed. In step 2 (mask fabrication), a mask formed with the designed pattern is fabricated. In step 3 (wafer manufacture), a wafer is manufactured by using a material such as silicon or glass. Step 4 (wafer process) is called a pre-process where the mask and wafer prepared above are used to form an actual circuit on the wafer in accordance with lithography. Step 5 (assembly) is called a post-process where the wafer fabricated in step 4 is formed into semiconductor chips. Step 5 includes an assembly step (dicing, bonding), a packaging step (chip encapsulation), and the like. In step 6 (inspection), inspection such as an operation confirmation test, a durability test, and the like of the semiconductor device fabricated in step 5 is performed. The semiconductor device is completed through these steps, and is shipped (step 7).

Figure 7:
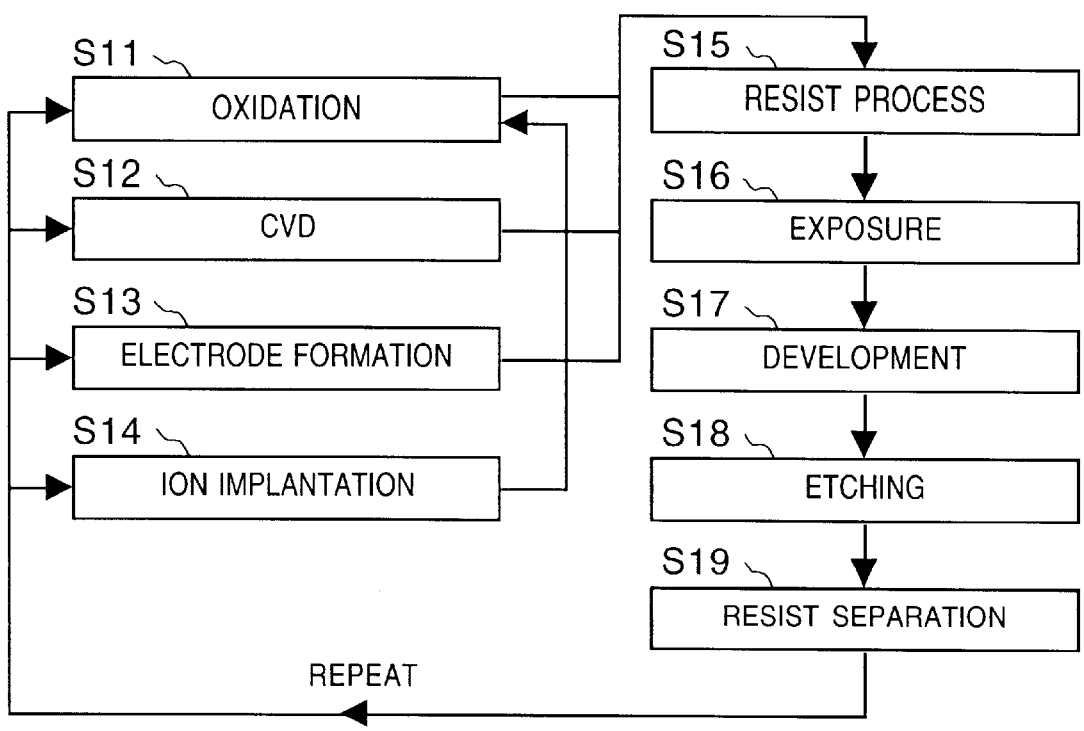
FIG. 7 is a flow chart showing the flow of the wafer process of FIG. 6 in detail.

FIG. 7 shows a detailed flow of the above wafer process. In step 11 (oxidation), the surface of the wafer is oxidized. In step 12 (CVD), an insulating film is formed on the wafer surface. In step 13 (electrode formation), an electrode is formed on the wafer by vapor deposition. In step 14 (ion implantation), ions are implanted in the wafer. In step 15 (resist process), a photosensitive agent is applied to the wafer. In step 16 (exposure), the circuit pattern of the mask is printed onto the wafer and exposed by the exposure method described above. Instep 17 (development), the exposed wafer is developed. In step 18 (etching), a portion other than the developed resist image is removed. In step 19 (resist separation), the resist which has become unnecessary after etching is removed. These steps are repeatedly performed to form circuit patterns on the wafer in a multiple manner.

When the manufacturing method of this embodiment is used, a high-integration device which is conventionally difficult to manufacture can be manufactured at a low cost.

The present invention is not limited to the above embodiments and various changes and modifications can be made within the spirit and scope of the present invention. Therefore, to appraise the public of the scope of the present invention, the following claims are made.

What is claimed is:

1. An exposure apparatus for scanning a reticle and a wafer in synchronism to optically transfer a pattern drawn on the reticle onto the wafer, thereby forming a device, said apparatus comprising:

a first drive means for holding and scanning the reticle;

a second drive means for holding and scanning the wafer;

determining means for determining a scanning distance of said first drive means and said second drive means by a sum of a first distance through which said first drive means and said second drive means travel until reaching a scanning speed, a second distance through which said first drive means and said second drive means travel during exposure, and a third distance through which said first drive means and said second drive means travel during a settling time from a time when said first drive means and said second drive means reach the scanning speed to a time when exposure is enabled; and a controller for controlling said first drive means and said second drive means by exposure parameters, the settling time being variably set in accordance with the exposure parameters.

2. The apparatus according to claim 1, wherein the exposure parameter is at least one of a traveling speed, an acceleration, a jerk time, a shot position, and a traveling direction of the substrate.

3. The apparatus according to claim 1, wherein the settling time is defined as a linear function of the scanning speed.

4. The apparatus according to claim 1, further comprising a look-up table for defining the settling time using the scanning speed, the look-up table being generated and updated in accordance with results obtained by driving said first drive means and said second drive means.

5. A device manufacturing method comprising the steps of:

holding and scanning a reticle with first drive means;

holding and scanning a wafer with second drive means; and determining, with determining means, a scanning distance of the first drive means and the second drive means by a sum of a first distance through which the first drive means and the second drive means travel until reaching a scanning speed, a second distance through which the first drive means and the second drive means travel during exposure, and a third distance through which the first drive means and the second drive means travel during a settling time from a time when the first drive means and the second drive means reach the scanning speed to a time when exposure is enabled;

controlling the first drive means and the second drive means by exposure parameters, the settling time being variably set in accordance with the exposure parameters; and manufacturing a device by scanning the wafer and the reticle in synchronism to optically transfer a pattern drawn on the reticle onto the wafer.

6. An exposure apparatus for scanning a reticle and a wafer in synchronism to optically transfer a pattern drawn on the reticle onto the wafer, thereby forming a device, said apparatus comprising:

first drive means for holding and scanning the reticle;

second drive means for holding and scanning the wafer;

determining means for determining a scanning distance through which at least one of said first drive means and said second drive means travel during a settling time, the settling time being variable, from a time when at least one of said first drive means and said second drive means reach the scanning speed to a time when exposure is enabled; and a controller for controlling at least one of said first drive means and said second drive means, in accordance with the scanning distance determined by said determining means.

7. The apparatus according to claim 6, wherein the determining means sets the scanning distance for only one of said first drive means and said second drive means, which has a longer scanning distance.

8. The apparatus according to claim 6, wherein said determining means determines the scanning distance for only said second drive means.

9. The apparatus according to claim 6, wherein the scanning time is set variably in accordance with at least one of an acceleration, a jerk time, and a traveling direction.

10. An exposure apparatus for scanning a reticle and a wafer in synchronism to optically transfer a pattern drawn on the reticle onto the wafer, thereby forming a device, said apparatus comprising:

first drive means for holding and scanning the reticle;

second drive means for holding and scanning the wafer;

determining means for determining a settling time of at least one of said first drive means and said second drive means, the settling time being variable based on at least one of an acceleration, a jerk time and a traveling direction of the reticle or the wafer, from a time when at least one of said first drive means and said second drive means reach the scanning speed to a time when exposure is enabled; and a controller for controlling at least one of said first drive means and said second drive means, in accordance with the settling time determined by said determining means.

11. The apparatus according to claim 10, wherein said determining means sets the settling time for only one of said first drive means and said second drive means, which has a longer setting time.

12. The apparatus according to claim 10, wherein said determining means determines the settling time for only said second drive means.

13. An exposure apparatus for scanning a reticle and a wafer in synchronism to optically transfer a pattern drawn on the reticle onto the wafer, thereby forming a device, said apparatus comprising:

a reticle stage for scanning the reticle;

a wafer stage for scanning the wafer; and a controller for controlling at least one of said reticle stage and said wafer stage, in accordance with a scanning distance through which at least one of said reticle stage and said wafer stage travel during a settling time, the settling time being variable, from a time when at least one of said reticle stage and said wafer stage reach the scanning speed to a time when exposure is enabled.

14. An exposure apparatus for scanning a reticle and a wafer in synchronism to optically transfer a pattern drawn on the reticle onto the wafer, thereby forming a device, said apparatus comprising:

a reticle stage for scanning the reticle;

a wafer stage for scanning the wafer; and a controller for controlling at least one of said reticle stage and said wafer stage, in accordance with a settling time of at least one of said reticle stage and said wafer stage, the settling time being variable based on at least one of an acceleration, a jerk time and a traveling direction of the reticle or the wafer, from a time when at least one of said reticle stage and said wafer stage reach the scanning speed to a time when exposure is enabled.

15. An exposure method for scanning a reticle and a wafer in synchronism to optically transfer a pattern drawn on the reticle onto the wafer, said method comprising the steps of:

holding and scanning the reticle with a first drive means;

holding and scanning the wafer with a second drive means;

determining, with determining means, a scanning distance through which at least one of the first drive means and the second drive means reach the scanning speed to a time when exposure is enabled; and controlling at least one of first drive means and the second drive means, in accordance with the scannning distance determined in said determining step.

16. An exposure method for scanning a reticle and a wafer in synchronism to optically transfer a pattern drawn on the reticle onto the wafer, said method comprising the steps of:

holding and scanning the reticle with a first drive means;

holding and scanning the wafer with a second drive means;

determining, with determining means, a settling time of at least one of the first drive means and the second drive means, the settling time being variable based on at least one of an aceleration, a jerk time and a traveling direction of the reticle or the wafer, from a time when at least one of the first drive means and the second drive means reach the scanning speed to a time when exposure is enabled; and controlling at least one of the first drive means and the second drive means, in accordance with the settling time determined in said determining step.

* * * * *

UNITED STATES PATENT AND TRADEMARK OFFICE
CERTIFICATE OF CORRECTION

PATENT NO.    : 6,411,365 B1                                              Page 1 of 1
DATED         : June 25, 2002
INVENTOR(S)   : Hiroaki Takeishi It is certified that error appears in the above-identified patent and that said Letters Patent is hereby corrected as shown below:

Column 6,
Line 7, the second occurrence of "to" should be deleted.

Column 7,
Line 67, "Instep" should read -- In step --.

Column 9,
Line 6, "wafer." should read -- wafer, --.
Line 53, "setting" should read -- settling --.

Column 10,
Line 8, "wafer" should read -- wafer stage --.
Line 35, "means reach" should read -- means travel during a settling time, the settling time being variable, from a time when at least one of the first drive means and the second drive means reach --.
Line 37, "first" should read -- the first --.
Line 49, "aceleration" should read -- acceleration --.

Signed and Sealed this

Fifteenth Day of April, 2003

JAMES E. ROGAN
*Director of the United States Patent and Trademark Office*